(12) United States Patent
Lefillastre et al.

(10) Patent No.: US 10,693,026 B2
(45) Date of Patent: Jun. 23, 2020

(54) PHOTOVOLTAIC MODULE COMPRISING A PLURALITY OF BIFACIAL CELLS AND METHOD FOR PRODUCING SUCH A MODULE

(71) Applicant: COMMISSARIAT A L'ENERGIE ATOMIQUE ET AUX ENERGIES ALTERNATIVES, Paris (FR)

(72) Inventors: Paul Lefillastre, Paris (FR); Eric Gerritsen, Bernin (FR)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 74 days.

(21) Appl. No.: 15/327,444

(22) PCT Filed: Jul. 27, 2015

(86) PCT No.: PCT/EP2015/067118
§ 371 (c)(1),
(2) Date: Mar. 8, 2017

(87) PCT Pub. No.: WO2016/012626
PCT Pub. Date: Jan. 28, 2016

(65) Prior Publication Data
US 2017/0236963 A1  Aug. 17, 2017

(30) Foreign Application Priority Data

Jul. 25, 2014  (FR) ...................................... 14 57200

(51) Int. Cl.
*H01L 31/068*  (2012.01)
*H01L 31/18*  (2006.01)
(Continued)

(52) U.S. Cl.
CPC ........ *H01L 31/0508* (2013.01); *H01L 31/042* (2013.01); *H01L 31/0504* (2013.01);
(Continued)

(58) Field of Classification Search
CPC .. H01L 31/0684; H01L 31/05; H01L 31/0463
(Continued)

(56) References Cited

U.S. PATENT DOCUMENTS 8,067,295 B2 * 11/2011 Yagiura ........... H01L 31/035281
136/244
2007/0074756 A1  4/2007 Yagiura et al.
(Continued)

FOREIGN PATENT DOCUMENTS

CN       1941428 A    4/2007
CN    102356471 A    2/2012
(Continued)

OTHER PUBLICATIONS

International Search Report for PCT/EP2015/067118 dated Sep. 30, 2015.
Preliminary Search Report for FR1457200 dated Mar. 17, 2015.

*Primary Examiner* — Niki Bakhtiari
(74) *Attorney, Agent, or Firm* — Lerner, David, Littenberg, Krumholz & Mentlik, LLP

(57) ABSTRACT

The invention concerns a method for producing a photovoltaic module, comprising:•—providing a plurality of bifacial photovoltaic cells each having a short-circuit current ratio (B),•—asymmetrically cutting each cell into two portions, such that the ratio between the surface areas of said portions is substantially equal to the short-circuit current ratio (B) of said cell or to the average short-circuit ratio of the set of cells,•—juxtapositioning said cell portions in a main plane of the module in order to form pairs of cell portions chosen such that the front face of the first portion has a short-circuit
(Continued)

current substantially equal to the short-circuit current of the rear face of the second portion, said portions being arranged such that the front face of the first portion and the rear face of the second portion coincide with the front face of the module,•—creating an electrical connection of the front face of the first portion with the rear face of the second portion.

7 Claims, 5 Drawing Sheets

(51) Int. Cl.
*H01L 31/05* (2014.01)
*H01L 31/042* (2014.01)

(52) U.S. Cl.
CPC ...... *H01L 31/0684* (2013.01); *H01L 31/1876* (2013.01); *Y02E 10/50* (2013.01)

(58) Field of Classification Search
USPC .................................................. 136/243–265
See application file for complete search history.

(56) References Cited

U.S. PATENT DOCUMENTS

| | | | |
|---|---|---|---|
| 2012/0103386 A1 | 5/2012 | Murakami et al. | |
| 2013/0104986 A1* | 5/2013 | Jung | B82Y 20/00 |
| | | | 136/260 |
| 2013/0112253 A1* | 5/2013 | Oh | H01L 31/03529 |
| | | | 136/255 |
| 2015/0107643 A1 | 4/2015 | Voarino et al. | |

FOREIGN PATENT DOCUMENTS

| | | |
|---|---|---|
| DE | 135014 A1 | 4/1979 |
| EP | 1770791 A1 | 4/2007 |
| EP | 2400560 A1 | 12/2011 |
| EP | 2654089 A2 | 10/2013 |
| WO | 2013167564 A2 | 11/2013 |
| WO | 2014071417 A2 | 5/2014 |

* cited by examiner

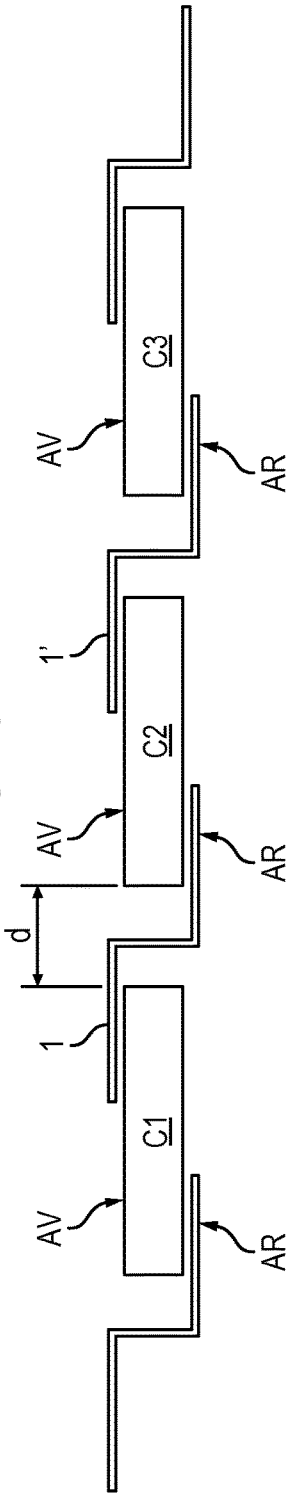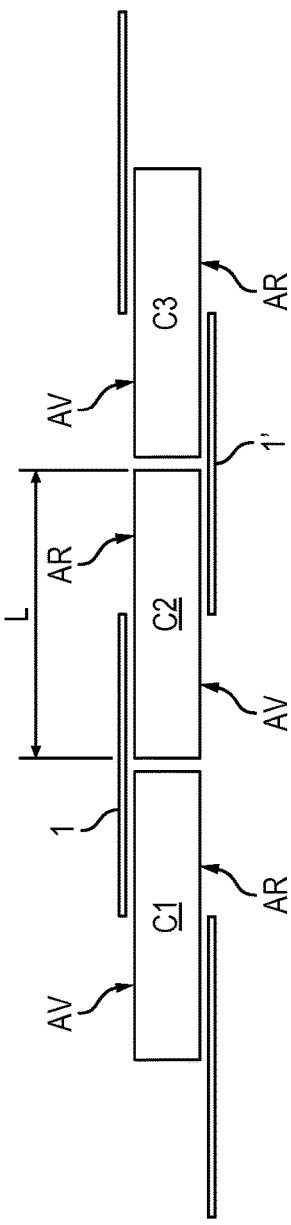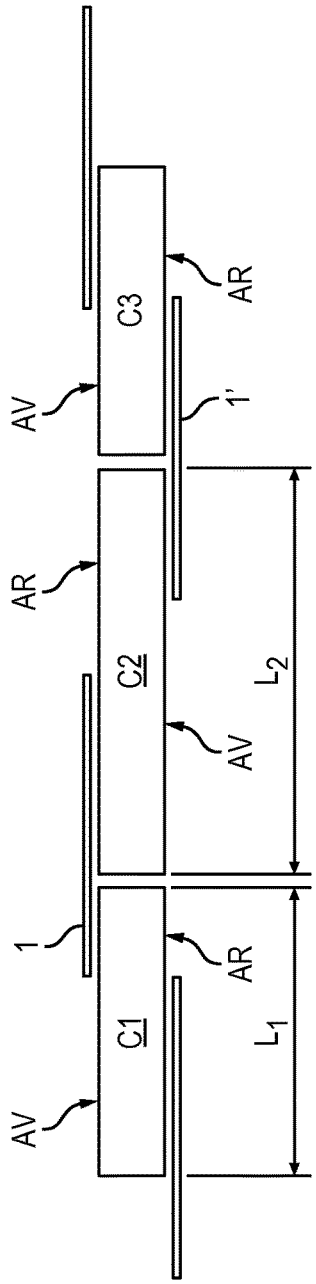

PHOTOVOLTAIC MODULE COMPRISING A PLURALITY OF BIFACIAL CELLS AND METHOD FOR PRODUCING SUCH A MODULE

CROSS REFERENCE TO RELATED APPLICATIONS

The present application is a national phase entry under 35 U.S.C. § 371 of International Application No. PCT/EP2015/067118, filed Jul. 27, 2015, published in French, which claims priority from French Patent Application No. 1457200, filed Jul. 25, 2014, the disclosures of which are hereby incorporated herein by reference.

FIELD OF THE INVENTION

The present invention relates to a photovoltaic module comprising a plurality of bifacial photovoltaic cells and a method for producing such a module.

BACKGROUND OF THE INVENTION

In a photovoltaic module, the photovoltaic cells may be connected in series by means of an electrically conducting element, such as a copper strip, which connects the front face of a cell to the rear face of the adjacent cell.

In such a module, the front face of the different cells is situated on the same side, forming the front face of the module, and the rear face is situated on the opposite side, forming the rear face of the module.

FIG. 1 illustrates this interconnection mode, referred to as "standard mode", in a partial sectional view of a module comprising cells C1, C2, C3.

The front face of the cells is designated by reference sign AV, the rear face is designated by reference sign AR.

To connect the front face of the cell C1 to the rear face of the cell C2, the copper strip 1 is not planar but crosses the module from the front face to the rear face.

Once the different cells are connected by means of the strips 1,1', etc. they are encapsulated in an encapsulating material 2 and laminated between two glass panels 3, 3', or between a glass panel on the front face and a polymer panel on the rear face (said polymer being able to be transparent or not according to whether the module is monofacial or bifacial).

The crossing of the strip from the front face to the rear face requires a deformation of the strip, which is capable of creating mechanical stresses in said strip, favouring chemical corrosion or instead mechanical fatigue of said strip and thus causing electrical (rupture of interconnections) or mechanical (fissuring) failures of said module.

This interconnection mode applies not just to monofacial cells (that is to say of which only one of the main faces is photoactive) but also to bifacial cells (of which the two main faces are photoactive). Such bifacial cells may be obtained by only metallizing locally the rear face of a conventional cell, for example in the form of a grid or any other form.

In the case of a module comprising bifacial cells, another possible interconnection mode is a so-called "monolithic" interconnection, shown schematically in FIG. 2.

Reference signs identical to those of FIG. 1 designate the same elements as those already described with reference to this figure.

In this interconnection mode, the cells are arranged according to the + and − polarity of the connections connecting the front face AV of a cell and the rear face AR of the adjacent cell.

This makes it possible to use a flat copper strip 1,1' to connect respectively the front face of the cell C1 to the rear face of the adjacent cell C2, on the front face of the module, and the front face of the cell C2 to the rear face of the adjacent cell C3, on the rear face of the module.

Such an interconnection mode is described for example in the patent DD 135 014.

The monolithic interconnection has the advantage of making it possible to connect simultaneously all the cells of the module, unlike the standard interconnection mode which includes a plurality of steps, the cells being connected successively to each other. The method for producing the module is moreover simplified by the fact that no prior deformation of the copper strips is necessary.

FIGS. 3A and 3B illustrate in a schematic manner the sequence for interconnecting cells respectively in the case of a standard interconnection and a monolithic interconnection.

In the case of a standard interconnection (FIG. 3A), on account of the conformation of the copper strip, a cell can only be assembled when the copper strip has been connected to the adjacent cell. The assembly thus requires a succession of steps E1, E2, E3, etc. until all of the cells have been connected.

In the case of a monolithic interconnection (FIG. 3B), the assembly is carried out in a single step, two series of copper strips (one on the side of the front face of the module, the other on the side of the rear face of the module) being simultaneously connected to the corresponding faces of the cells.

Another advantage of monolithic interconnection is that it minimizes stresses in the copper strips and thus limits the risks of failure linked to said strips.

Yet another advantage of monolithic interconnection is that the spacing of the cells may be minimized. In fact, in standard interconnection, a certain spacing of the cells is necessary to enable the crossing of the copper strip from the front face to the rear face. Such a spacing is largely reduced, thus increasing the area efficiency (W/m$^2$) of the module, in the case of a monolithic interconnection.

It is in addition known that bifacial photovoltaic cells have a different conversion efficiency between the front face and the rear face. This difference is due on the one hand to the physical properties of the material forming the cell and on the other hand to the presence of a denser metallization on the side of the rear face than on the side of the front face. This difference may also result from the choice of optimizing the efficiency of one of the two faces to the detriment of the other.

FIG. 4 illustrates as an example the conversion efficiency R (Internal Quantum Efficiency) of the front face (curve a) and of the rear face (curve b) of a bifacial cell as a function of the wavelength A.

Generally, in bifacial cells currently present on the market, the ratio between the conversion efficiency between the front face and the rear face is of the order of 70% to 95%.

In a photovoltaic module comprising a plurality of cells, the electric current generated depends on the cell that produces the least current.

Consequently, in a monolithic arrangement as described above, the electric current produced by the module is only 70 to 95% of the current that would have been produced by the module if said module had been assembled according to the standard interconnection mode.

BRIEF DESCRIPTION OF THE INVENTION

An aim of the invention is thus to design a photovoltaic module that can be assembled in a monolithic manner and in which the generation of electric current is maximized.

In accordance with the invention, a method is proposed for producing a photovoltaic module having a front face intended to be exposed to solar radiation, said method comprising at least the following steps:
  providing a plurality of bifacial photovoltaic cells each having a short-circuit current ratio, defined, for each cell, as being the ratio between:
  the short-circuit current generated when the rear face of said bifacial photovoltaic cell is illuminated, and
  the short-circuit current generated when the front face of said cell is illuminated,
  asymmetrically cutting each cell into a first and a second portion, such that the ratio between the surface areas of said portions is substantially equal to the short-circuit current ratio (B) of said cell or to the average short-circuit ratio of the set of cells,
  juxtaposing said cell portions in a main plane of the module to form pairs of cell portions chosen such that the front face of the first portion has a short-circuit current substantially equal to the short-circuit current of the rear face of the second portion, said portions being arranged such that the front face of the first portion and the rear face of the second portion coincide with the front face of the module,
  creating an electrical connection of the front face of the first portion with the rear face of the second portion.

The short-circuit current ratio of said cells is typically strictly less than 1.

"Current substantially equal to the short-circuit current" is taken to mean a current comprised in a range of ±2% with respect to the short-circuit current, preferably in a range of ±1% with respect to this current and in an even more preferred manner in a substantially zero range around this current.

According to an embodiment, the short-circuit current ratio according to which each cell is cut is the short-circuit current ratio specific to said cell.

Alternatively, the short-circuit current ratio according to which each cell is cut is the average short-circuit current ratio of the set of cells.

According to a form of execution of the invention, the step of asymmetrical cutting is followed by a step of symmetrical cutting each of the first and second portions, in the sense of the width or in the sense of the length of said portions.

The electrical connection between two cell portions is typically made by a strip of an electrically conducting material.

In a particularly advantageous manner, said strip extends in a plane.

The method moreover comprises:
  juxtaposing the portions of all the cells in a main plane of the module,
  the simultaneous creation of electrical connections between the portions of a same cell and between adjacent cell portions.

The invention also relates to a photovoltaic module capable of being obtained by such a method.

Said module has a front face intended to be exposed to solar radiation and includes a plurality of portions of asymmetrical bifacial photovoltaic cells juxtaposed by pairs, in which, for each pair:
  the front face of the first portion and the rear face of the second portion coincide with the front face of the module,
  the front face of the first portion is electrically connected with the rear face of the second portion, and the front face of the second portion is electrically connected with the rear face of the first portion of an adjacent pair,
  the short-circuit current of the front face of the first portion is substantially equal to the short-circuit current of the rear face of the second portion.

The electrical connection between two cell portions is made by a strip of an electrically conducting material.

In a particularly advantageous manner, said strip extends in a plane.

BRIEF DESCRIPTION OF THE DRAWINGS

Other characteristics and advantages of the invention will become clearer from the detailed description that follows, with reference to the appended drawings, in which.

DETAILED DESCRIPTION OF THE INVENTION

The method for producing a photovoltaic module includes the successive steps described hereafter.

The photovoltaic module is intended to be produced by monolithic assembly of a plurality of bifacial cells. Said photovoltaic module has a front face and a rear face.

Firstly, from a batch of bifacial cells intended to form the module, the short-circuit current (noted Isc, expressed in mA) is determined for each of the faces of the cell. By convention, the front face (FAV) of the cell is the face of the cell for which the short-circuit current Isc is the largest and the rear face (FAR) of the cell is that for which the short-circuit current is the smallest of the two measured. The short-circuit current ratio B between the rear face and the front face is deduced from these measurements.

As an example, table 1 below illustrates the properties of the front face and of the rear face of a batch of nine cells.

The physical quantity Voc designates the voltage of the open circuit (in V), Pmax is the maximum power supplied and FF is the form factor.

The final column of table 1 indicates the ratio B between the short-circuit current of the rear face and the short-circuit current of the front face.

TABLE 1

| Cell | FAV | | | | FAR | | | | Ratio Isc |
| | Isc | Pmax | Voc | FF % | Isc | Pmax | Voc | FF % | FAR/FAV |
| --- | --- | --- | --- | --- | --- | --- | --- | --- | --- |
| 12 | 9486 | 4793 | 647 | 78.08 | 8536 | 4307.7 | 634.7 | 78.39 | 89.98% |
| 14 | 9420 | 4733.9 | 646.2 | 77.76 | 8497 | 4291.7 | 643.4 | 78.50 | 90.20% |
| 15 | 9398 | 4753.1 | 646.7 | 78.20 | 8493 | 4286.6 | 643.7 | 78.90 | 90.37% |
| 16 | 9397 | 4758.4 | 645.5 | 78.44 | 8428 | 4283.0 | 642.5 | 79.10 | 89.69% |
| 17 | 9365 | 4747.8 | 645.7 | 78.55 | 8349 | 4236.5 | 642.3 | 79.0 | 89.15% |
| 18 | 9427 | 4810.8 | 644.8 | 79.14 | 8373 | 4248.5 | 640.7 | 79.3 | 88.82% |
| 19 | 9450 | 4757.4 | 646.5 | 77.87 | 8429 | 4251.5 | 643.2 | 78.4 | 89.19% |
| 20 | 9429 | 4762.4 | 645.7 | 78.2 | 8443 | 4264.8 | 642.9 | 78.6 | 89.54% |
| 22 | 9455 | 4736.0 | 646.0 | 77.5 | 8378 | 4239.7 | 642.8 | 78.7 | 88.61% |

For this batch of cells, the arithmetic mean of the ratios of the short-circuit currents between the rear face and the front face—or average Isc ratio—is equal to 89.50%.

According to an embodiment, each cell is then cut into two portions in an asymmetrical manner while respecting said average Isc ratio, that is to say by ensuring that the ratio of the surface areas of the two portions of each cell is equal to the ratio B.

Figure 1:
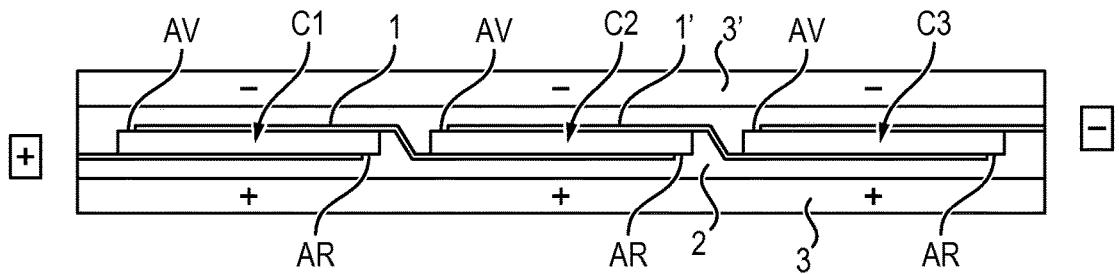
FIG. 1 is a sectional view of a part of a module assembled according to a standard interconnection mode.
Figure 2:
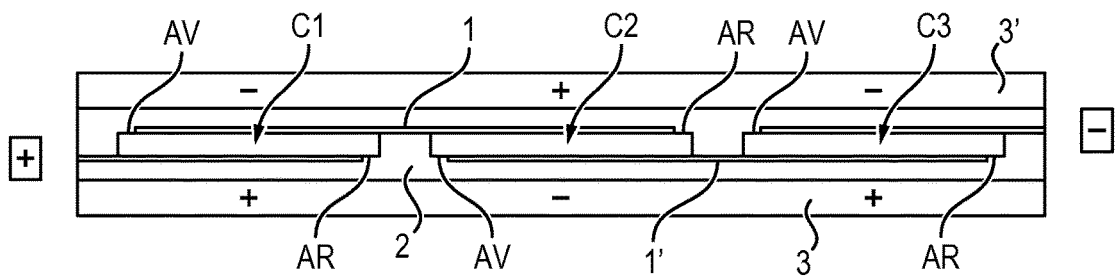
FIG. 2 is a sectional view of a part of a module assembled according to a monolithic interconnection mode, FIGS. 3A and 3B schematically illustrate respectively the steps of the standard interconnection method and the monolithic interconnection method.
Figure 3A:
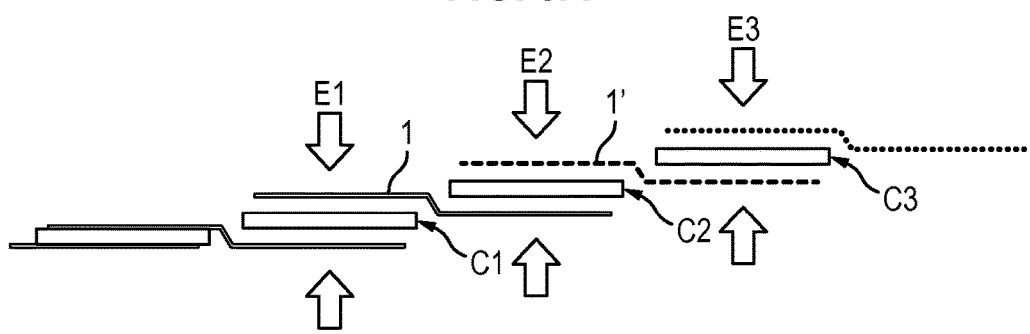
Figure 3B:
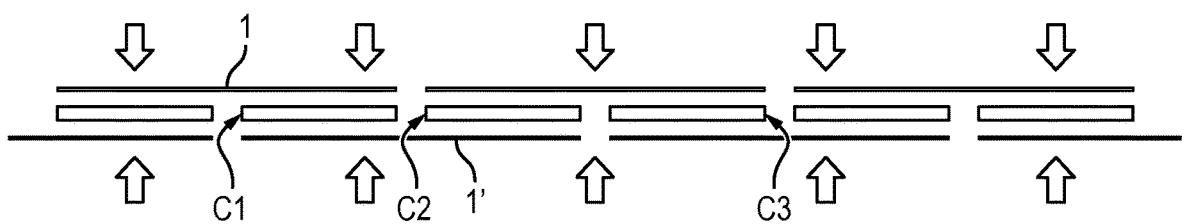
Figure 4:
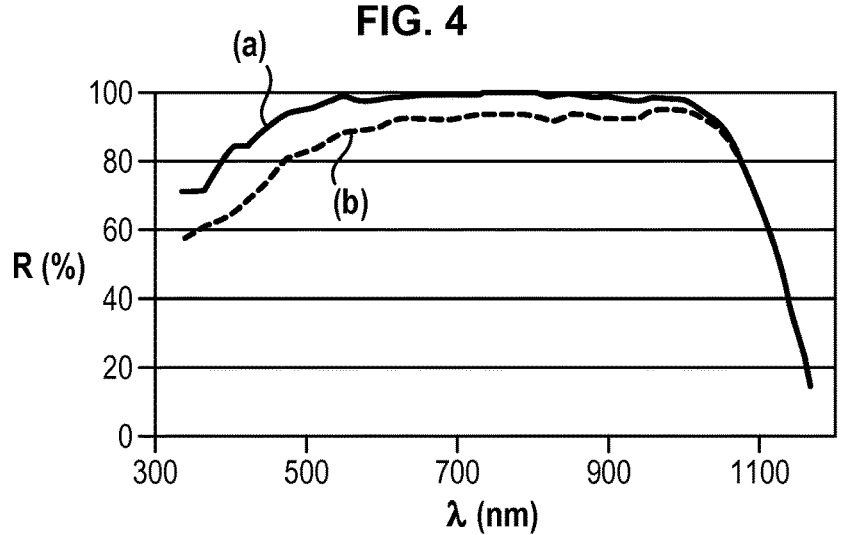
FIG. 4 illustrates the efficiency of the front face (curve a) and of the rear face (curve b) of a bifacial photovoltaic cell.
Figure 5:
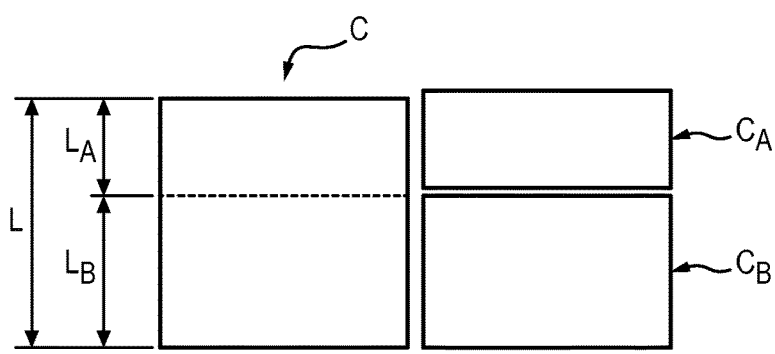
FIG. 5 illustrates the principle of cutting a cell taking account of the short-circuit current ratio in accordance with the invention.

For example, as illustrated in FIG. 5, each cell C has a rectangular shape of length L.

Each cell C is cut in the sense of the width, into two portions $C_A$, $C_B$ of respective lengths $L_A$ and $L_B$, the ratio $L_A/L_B$ being equal to the average ratio of the short-circuit circuits, i.e. 89.44%, and the sum $L_A+L_B$ being equal to the length L of the cell. The two portions of cell $C_A$, $C_B$ are thus not symmetrical with respect to the cutting line indicated in dotted lines.

Figure 6A:
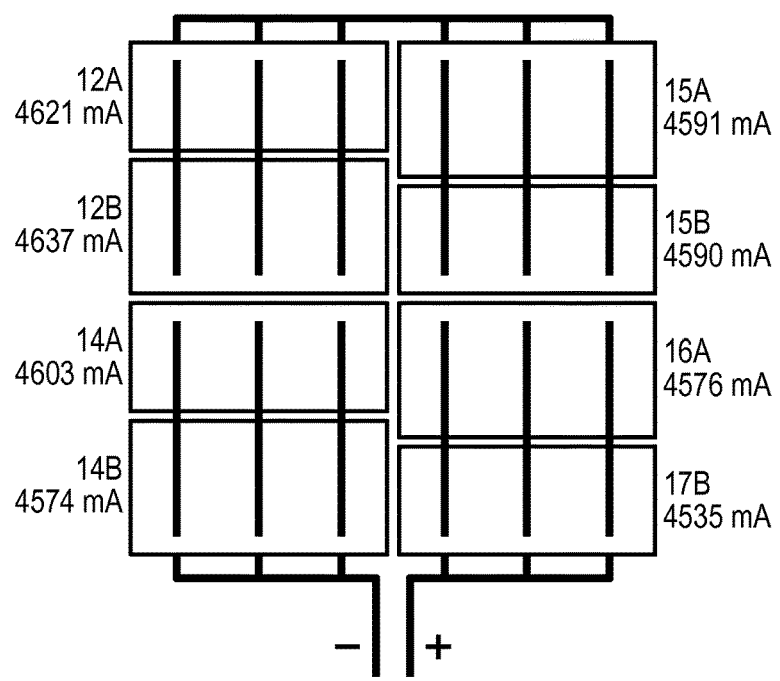
FIG. 6A illustrates an example of assembling cell portions in a module according to the invention, the view presented being that of the front face of said module.

With reference to FIG. 6A, the cut cell portions are then assembled according to the principle described above to form the module. In the example represented in FIG. 6A, they are the cells 12, 14, 15, 16 and 17 of table 1 which have been assembled to form the module.

To this end, it is ensured that the portions coming from a same cell are adjacent, the portion having the smallest surface area (designated by the number of the cell from which it comes followed by the letter A) being oriented such that its front face coincides with the front face of the module, whereas the portion having the largest surface area (designated by the number of the cell from which it comes followed by the letter B) is oriented such that its rear face coincides with the front face of the module.

An electrical connection is made on the one hand between the portions of the cell and on the other hand between cells. For example, as illustrated in FIG. 6A, on the side of the front face of the module (which is the face visible in this figure), two portions of a same cell are connected by means of three parallel electrically conducting strips, and, on the side of the rear face of the module, two portions of two adjacent cells are connected by means of three parallel electrically conducting strips.

Each of said strips thus extends either in the plane of the front face, or in the plane of the rear face of the module. It is thus a monolithic assembly.

An advantage of such an assembly is that it makes it possible to connect simultaneously the different portions of bifacial cells, which makes the assembly method simpler and quicker. Moreover, by avoiding the crossing of the conducting strips between the front face and the rear face of the module, this construction is also more robust and limits failures due to the conducting strips.

Naturally, the number and the dimensions of said strips could be modified without however going beyond the scope of the present invention.

Then, the production of the module is finalized by sandwiching the cell portions thus connected between two sheets of encapsulating material and by laminating the assembly between two panels forming the front and rear faces of the module. The front and rear panels may be made of glass and/or of polymer. This latter step is known per se and thus does not require detailed decription.

In such a module, the fact that the short-circuit current of the cell is higher on the front face is compensated by the fact that the surface area of the portion of cell of which the front face is exposed (portion 12A for example) is smaller, whereas the fact that the short-circuit current is lower on the rear face is compensated by the fact that the surface area of the portion of cell of which the rear face is exposed (portion 12B for example) is larger.

Preferably, the module thereby formed is a monofacial rather than bifacial module. In fact, the cutting and the layout of the cell portions improves the electrical performance of the module on the front face but tends to degrade it on the rear face.

Thus, focusing uniquely on the front face of the module, the short-circuit current is substantially equal from one portion to the other for a same cell.

This is illustrated in table 2 below, which presents the short-circuit current for the front face and the rear face of each portion of cell.

TABLE 2

| Portion of cell | FAV Isc | FAR Isc |
| --- | --- | --- |
| 12A | 4621 | 4159 |
| 12B | 5206 | 4637 |
| 14A | 4603 | 4151 |
| 14B | 5178 | 4674 |
| 15A | 4591 | 4120 |
| 15B | 5148 | 4590 |
| 16A | 4576 | 4097 |
| 17B | 5108 | 4535 |

It will be noted that within the batch of cells presented above, the inventor has chosen to match the front face 16A of the cell 16 with the rear face 17B of the cell 17, in order to obtain similar short-circuit currents. In this particular case, the values of the short-circuit currents of the portions 16B and 17A of the cells 16 and 17 were not satisfactory and these two cell portions were thus excluded.

More generally, it will be noted that it is not necessary to match the portions from a same cell to implement the invention. It is in fact entirely possible to form pairs of cell portions on the basis uniquely of the Isc values of the front and rear faces of said portions and by associating the portions having the Isc values the most similar to each other.

For this assembly of cell portions cut in an asymmetrical manner, the minimum short-circuit current is 4576 mA for the portions of which the front face is exposed and 4535 mA for the portions of which the rear face is exposed. These two minima being substantially equal, this signifies that the performance of the module will not be significantly affected by differences in short-circuit current between cell portions.

Figure 6B:
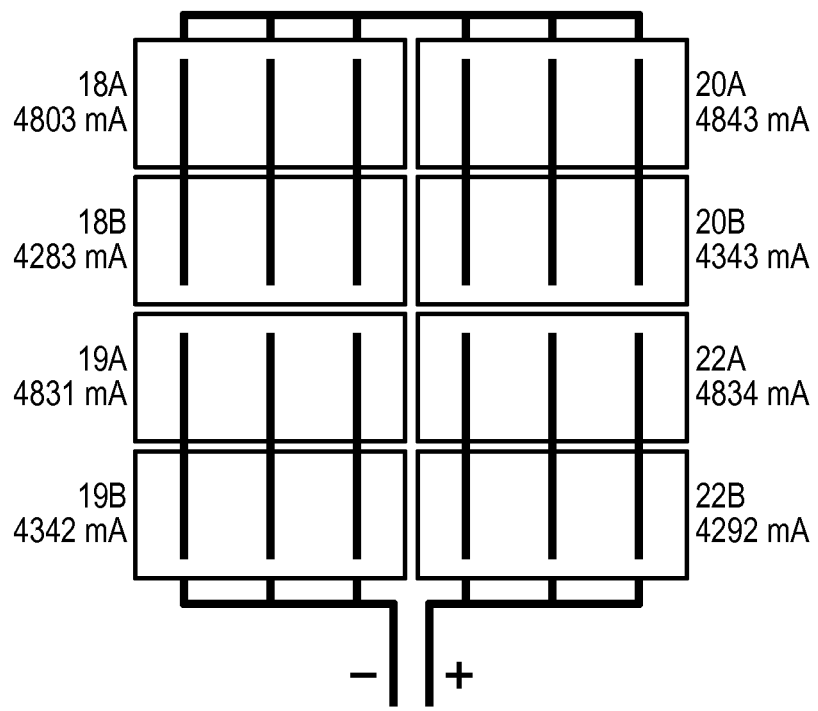
FIG. 6B illustrates an example of assembling symmetrical cell portions into a module, not falling within the scope of the present invention.

As a comparison, as illustrated in FIG. 6B, the cells 18, 19, 20 and 22 have for their part been cut in a symmetrical manner, that is to say that the lengths of each portion are identical. In other words, the surface areas of two portions of each cell are identical.

Such a symmetrical cutting mode, which is excluded from the present invention, is disclosed in the document EP 1 770 791 which also pertains to a method of monolithic interconnection. In this case, cutting is used to facilitate the assembly of the cells in modules. In fact, hexagonal cells are cut into four identical portions and said parts are arranged along their respective oblique face so as to form rectangles. The interconnection of the cell portions thus arranged is then made.

To form the module, each portion of cell designated by the letter A is oriented with its front face coinciding with the front face of the module and each portion of cell designated by the letter B is oriented with its rear face coinciding with the front face of the module.

Table 3 below has the short-circuit current for the front face and the rear face of each cell portion.

TABLE 3

| Portion of cell | FAV Isc | FAR Isc |
|---|---|---|
| 18A | 4803 | 4310 |
| 18B | 4808 | 4283 |
| 19A | 4831 | 4312 |
| 19B | 4864 | 4342 |
| 20A | 4843 | 4329 |
| 20B | 4838 | 4343 |
| 22A | 4834 | 4292 |
| 22B | 4859 | 4292 |

For each cell, a significant difference is thus observed between the short-circuit current of the front face of one portion and the short-circuit current of the rear face of the other portion (the latter being oriented on the side of the front face of the module).

In fact, in this example, the minimum short-circuit current is 4804 mA for the portions of which the front face is exposed and 4284 mA for the portions of which the rear face is exposed, i.e. a difference of more than 500 mA. This signifies that, even if the portions of which the front face is exposed have a high short-circuit current, the performance of the module will be conditioned by the portion of which the rear face is exposed and which has the lowest short-circuit current.

Figure 7:
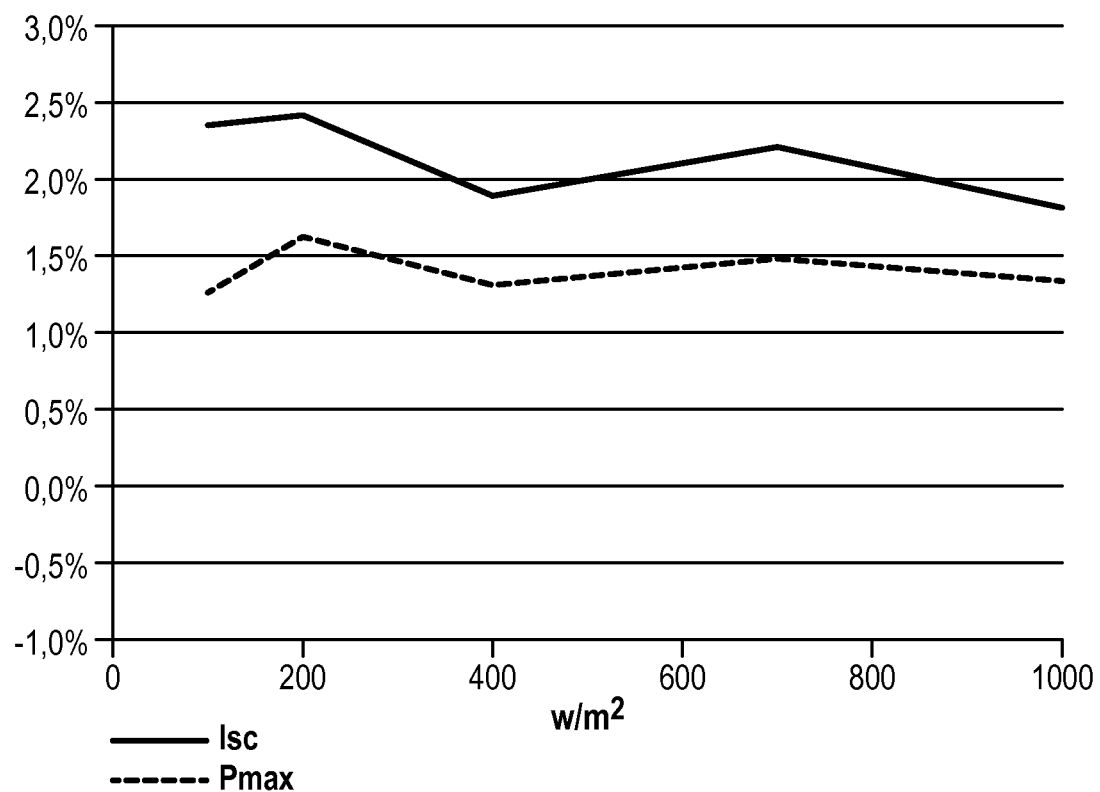
FIG. 7 is a graph presenting the gain in maximum power (Pmax) and in short-circuit current (Isc) as a function of the illumination for a photovoltaic module according to the invention.

FIG. 7 illustrates the gain in short-circuit current (Isc) and in maximum power (Pmax) for the module illustrated in FIG. 6A.

A gain in Pmax of the order of +1.5% is observed for this module.

The embodiment described above provides a cutting of each cell into two portions in the sense of the width.

It is however possible to provide other modes of cutting the cells (in terms of number of portions and/or sense of cutting the portions) without nevertheless going beyond the scope of the present invention. As a general rule, the number of cell portions is even, which makes it possible to match the front face of one portion and the rear face of another portion of the same cell or of another cell, while conserving substantially the same total surface area for all of the pairs of cell portions.

Figure 8A:
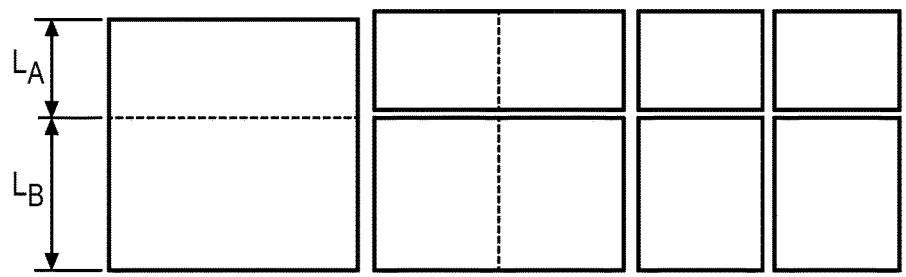
FIGS. 8A and 8B illustrate variants of cutting a bifacial cell taking account of the short-circuit current ratio according to the invention.

Thus, FIG. 8A illustrates a variant of execution in which a cell (illustrated in the left part of the figure) is successively cut into two portions in the sense of its width in an asymmetrical manner (that is to say while respecting the ratio $L_A/L_B=B$ as taught above) then in the sense of its length in a symmetrical manner (central part of FIG. 8A). As illustrated in the right part of FIG. 8A, four portions of cell are thus obtained.

Figure 8B:
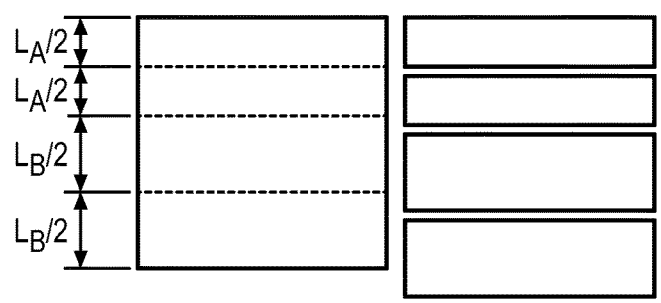

FIG. 8B illustrates another variant of execution in which a cell (illustrated in the left part of the figure) is cut into two portions in the sense of its width in an asymmetrical manner (that is to say while respecting the ratio $L_A/L_B=B$ as taught above), then each portion is again cut into two in the same sense, in a symmetrical manner. As illustrated in the right part of FIG. 8B, four portions of cell are thus obtained, two having a length $L_A/2$ and two having a length $L_B/2$.

In the two embodiments described above, a first asymmetrical cutting operation is carried out as a function of the ratios B, then it is followed by an operation of symmetrical cutting, either in the length, or in the width. These embodiments make it possible to reduce the current of each "string" of cell portions and thus to limit current losses by Joule effect. It should be recalled that a string of cells conventionally corresponds to a unit of cells connected in series. In a standard module, a string includes around ten cells and the strings are interconnected together.

Furthermore, the invention does not impose that the cells are cut in an asymmetrical manner while respecting the same ratio B for all of the cells, corresponding to the average ratio of the set of cells.

According to an embodiment of the invention, the ratio B is determined for each cell and said cell is cut while respecting the respective ratio B.

Figure 9A:
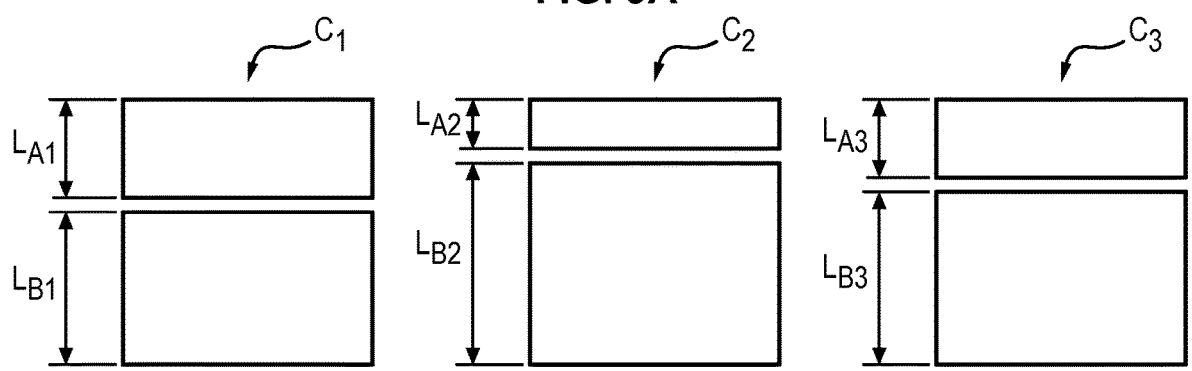
FIGS. 9A and 9B illustrate respectively the cutting of each bifacial cell according to the short-circuit current ratio that is specific to it and the assembly of the portions of said cells, FIGS. 10A to 10C schematically present the principles of connection of bifacial cells respectively with the standard connection, with the monolithic connection with bifacial cells of identical surface areas and with asymmetrical bifacial cells according to the invention.

As illustrated in FIG. 9A, three cells C1, C2, C3 having different short-circuit current ratios are considered. The cell C1 is thus cut into two portions in the sense of the width, while ensuring that the ratio $L_{A1}/L_{B1}$ is equal to the ratio B for this cell; the cell C2 is cut into two portions in the sense of the width, while ensuring that the ratio $L_{A2}/L_{B2}$ is equal to the ratio B for this cell; finally, the cell C3 is cut into two portions in the sense of the width, while ensuring that the ratio $L_{A3}/L_{B3}$ is equal to the ratio B for this cell.

Figure 9B:
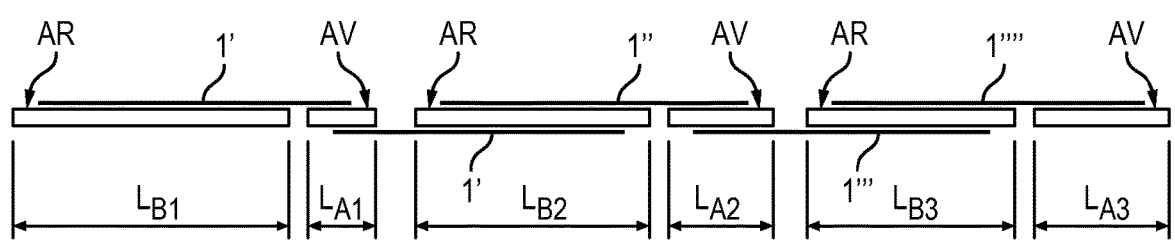

FIG. 9B illustrates the connection of the portions of said cells to form a module.

The portions $L_{A1}$, $L_{A2}$ and $L_{A3}$ having the smallest surface area are arranged such that their front face coincides with the front face of the module, whereas the portions $L_{B1}$, $L_{B2}$ and $L_{B3}$ having the largest surface area are arranged such that their rear face coincides with the front face of the module.

An electrical connection 1, 1", 1"" is made between the portions of each pair ($L_{A1}$, $L_{b1}$), ($L_{A2}$, $L_{B2}$) and ($L_{A3}$, $L_{B3}$)

at the level of the front face of the module and an electrical connection 1', 1''' is made between adjacent portions of two different pairs at the level of the rear face of the module. Each of these connections is made by a flat strip of an electrically conducting material.

This embodiment has the advantage of optimizing the cutting of each cell, since the cutting ratio depends specifically on the ratio B of said cell.

FIGS. 10A to 10C illustrate the advantages of the monolithic connection with bifacial cells according to the invention (illustrated in FIG. 10C), compared to the standard connection with bifacial cells (illustrated in FIG. 10A) and compared to the monolithic connection with bifacial cells of identical surface areas (illustrated in FIG. 10B).

With reference to FIG. 10A, bifacial cells C1, C2, C3 are arranged successively, the front faces AV of each of these cells being coplanar and forming the front face of the module. The rear faces AR of each of these cells are coplanar and form the rear face of the module.

The front face of a cell is electrically connected to the rear face of the adjacent cell by means of an electrically conducting strip 1,1'.

To facilitate the passage of said conducting strip from the front face of a cell to the rear face of the adjacent cell, a sufficiently important distance d is arranged between two adjacent cells. For example, the distance d is typically of the order of 2 to 4 mm.

With reference to FIG. 10B, bifacial cells C1, C2, C3 each having an identical length L, are arranged successively, the front face AV of the cell C1 being coplanar with the rear face AR of the adjacent cell C2 on the side of the front face of the module and an electrical connection being ensured between these two coplanar faces by means of an electrically conducting strip 1. The front face AV of the cell C2 is coplanar with the rear face AV of the adjacent cell C3, on the side of the rear face of the module, and an electrical connection is ensured between these two coplanar faces by means of an electrically conducting strip 1'. In other words, the front face of the module alternatively comprises the front face of a cell and the rear face of an adjacent cell.

In so far as the conducting strips 1,1' each extend in a plane, the distance arranged between two adjacent cells may be less than the distance d provided for the standard connection. This inter-cell distance may typically be of the order of 1 mm.

With reference to FIG. 10C, which illustrates an embodiment of the invention, bifacial cells C1, C2, C3 each having an identical length L, are arranged successively by pairs. Within the pair C1, C2, the front face AV of the cell C1 is coplanar with the rear face AR of the adjacent cell C2 on the side of the front face of the module and an electrical connection is ensured between these two coplanar faces by means of an electrically conducting strip 1. As described above, the length $L_1$ of the cell C1 and the length $L_2$ of the cell C2 obey the relation: $L_1/L_2=B$, where B is the Isc ratio. The front face AV of the cell C2 is coplanar with the rear face AV of the adjacent cell C3, which belongs to another pair of cells, on the side of the rear face of the module, and an electrical connection is ensured between these two coplanar faces by means of an electrically conducting strip 1'.

The ratio between the area efficiency of the monolithic connection according to the invention (FIG. 10C) and the area efficiency of the standard connection (FIG. 10A) is equal to: 2B/(1+B). This ratio is less than 1, which signifies that the area efficiency of the module in accordance with the invention is lower (of the order of −5% if B=90%) than that of a module with a standard connection. On the other hand, the module according to the invention benefits from an easier and quicker assembly method, and is less subject to electrical and mechanical failures of the conducting strips. On the other hand, as is described below, the module according to the invention allows a smaller spacing between cell portions. This represents a gain of around 1.3% for cells of size 156 mm*156 mm. Indeed, a standard spacing of 4 mm for cells of 156 mm is considered. Since the invention uses cut cells (of the order of 78 mm) and a spacing of 1 mm, the gain is (156+4)/(2*(78+1))=160/158=1.013, i.e. 1.3%)

The ratio between the area efficiency of the monolithic connection according to the invention (FIG. 10C) and the area efficiency of the monolithic connection with symmetrical cells (FIG. 10B) is equal to: 2/(1+B). This ratio is greater than 1, which signifies that the area efficiency of the module in accordance with the invention is higher (of the order of +5% if B=90%) than that of a module with a monolithic connection with symmetrical cells.

The relative loss AR (in %) of the area efficiency linked to the spacing of the cells is given by the formula: AR=d/L*100%.

With a monolithic module, the distance d between cells may be reduced to 1 mm, which represents a reduction in distance from 1 to 3 mm with respect to the distance between cells with a standard connection. If cells of length L=156 mm are considered, the relative gain in efficiency is comprised between 1/156 and 3/156 for the symmetrical monolithic module of FIG. 10B, is between 0.6% and 2%. For the asymmetrical monolithic module according to the invention (FIG. 10C), the cut cells have a length of around 78 mm, hence a maximum gain of 1.3% as described above.

REFERENCES

DD 135 014
EP 1 770 791

The invention claimed is:

1. A method for producing a photovoltaic module having a front face intended to be exposed to solar radiation, the photovoltaic module comprising a plurality of bifacial photovoltaic cells, each bifacial photovoltaic cell having a first face and an opposing second face, and each bifacial photovoltaic cell exhibiting a short-circuit current ratio, said ratio being defined, for each bifacial photovoltaic cell, as being the ratio between:
   a first short-circuit current generated when the first face of said bifacial photovoltaic cell is illuminated, to
   a second short-circuit current generated when the second face of said bifacial photovoltaic cell is illuminated,
   wherein the first short-circuit current is different than the second short-circuit current, the method comprising:
   asymmetrically cutting each bifacial photovoltaic cell into a first portion and a second portion, such that for a given bifacial photovoltaic cell a surface area ratio between the surface area of the second portion to the surface area of the first portion is substantially equal to the short-circuit current ratio of said bifacial photovoltaic cell or to the average short-circuit current ratio of the plurality of bifacial photovoltaic cells;
   arranging the first face of the first portion and the second face of the second portion to coincide with the front face of the photovoltaic module, whereby the first face of the first portion and the second face of the second portion are intended to be exposed to solar radiation;
   juxtaposing said bifacial photovoltaic cell portions in a main plane of the photovoltaic module to form a pair of bifacial photovoltaic cell portions, such that the first face of the first portion has a short-circuit current substantially equal to the short-circuit current of the second face of the second portion;

creating an electrical connection of the first face of the first portion with the second face of the second portion.

2. The method according to claim 1, wherein each bifacial photovoltaic cell is asymmetrically cut such that the surface area ratio between the surface area of the second portion and the surface area of the first portion is substantially equal to the short-circuit current ratio of said bifacial photovoltaic cell, wherein a short-circuit current generated when the first face of the first portion is illuminated is substantially equal to a short-circuit current generated when the second face of the second portion is illuminated.

3. The method according to claim 1, wherein each bifacial photovoltaic cell is asymmetrically cut such that the surface area ratio between the surface area of the second portion and the surface area of the first portion is substantially equal to the average short-circuit current ratio of the plurality of bifacial photovoltaic cells.

4. The method according to claim 1, wherein the step of asymmetrically cutting is followed by a step of a lengthwise or widthwise symmetrical cutting of each of the first and second portions.

5. The method according to claim 1, wherein the electrical connection between the first and second bifacial photovoltaic cell portions is made by a strip of an electrically conducting material.

6. The method according to claim 5, wherein said strip is planar.

7. The method according to claim 5, comprising:

Juxtaposing the portions of all of the plurality of bifacial photovoltaic cells in the main plane of the photovoltaic module, and Creating respective electrical connections between adjacent bifacial photovoltaic cell portions.

* * * * *